United States Patent [19]

Albertsen

[11] Patent Number: 5,048,019

[45] Date of Patent: Sep. 10, 1991

[54] METHOD OF TESTING A READ-ONLY MEMORY AND DEVICE FOR PERFORMING THE METHOD

[75] Inventor: Hans-Gerd Albertsen, Hamburg, Fed. Rep. of Germany

[73] Assignee: U.S. Philips Corporation, New York, N.Y.

[21] Appl. No.: 366,571

[22] Filed: Jun. 15, 1989

[30] Foreign Application Priority Data

Jun. 18, 1988 [DE] Fed. Rep. of Germany ..... 38207281

[51] Int. Cl.$^5$ .................. G06F 11/00; G11C 29/00
[52] U.S. Cl. .................. 371/21.1; 371/16.1; 371/16.2
[58] Field of Search .......... 371/16.1, 16.2, 21.1; 364/200 MS File, 900 MS File

[56] References Cited

U.S. PATENT DOCUMENTS

| | | | |
|---|---|---|---|
| 4,334,307 | 6/1982 | Bourgois et al. | 371/16.1 |
| 4,339,801 | 7/1982 | Hosaka et al. | 371/16.1 |
| 4,455,654 | 6/1984 | Bhaskar et al. | 371/16.2 |
| 4,622,647 | 11/1986 | Sagnard et al. | 371/16.2 |
| 4,691,316 | 9/1987 | Phillips | 371/16.2 |
| 4,777,586 | 10/1988 | Matsubara et al. | 369/200 |
| 4,868,822 | 9/1989 | Scott et al. | 371/16.2 |
| 4,933,941 | 6/1990 | Eckard et al. | 371/16.2 |

Primary Examiner—Charles E. Atkinson
Attorney, Agent, or Firm—Anne E. Barschall

[57] ABSTRACT

Microcontrollers generally comprise, in addition to the actual processor, a program memory which is constructed as a read-only memory. In order to enable testing of the contents of the program memory without making these contents also available to the environment of the microcontroller, the reference data of the program are externally supplied and the comparison is performed inside the microcontroller. In accordance with the invention this test is preferably performed as a small test program which is preferably stored in an additional read-only memory in the microcontroller which operates in the test mode and which performs this test. Consequently, except for the memory for the test program, this test program requires hardly any additional hardware.

14 Claims, 2 Drawing Sheets

METHOD OF TESTING A READ-ONLY MEMORY AND DEVICE FOR PERFORMING THE METHOD

BACKGROUND OF THE INVENTION

1. Field of the Invention

The invention relates to a method of testing the contents of a read-only memory in an integrated circuit which also comprises a processor which is controlled by the contents of the read-only memory and also comprises an arithmetic unit and a storage register. The processor is connected to external connections of the integrated circuit and is switchable to a test mode in which the contents of the read-only memory in the integrated circuit are compared with externally supplied test data, an error message is generated in the case of non-correspondence. The invention also relates to a device for performing the method.

2. Prior Art

A method of this kind and an appropriate device are known from U.S. Pat. No. 4,777,586. The program stored in the read-only memory is often developed by the customer at substantial expense, possibly with the assistance of the manufacturer of the microcontroller, so that this program represents a substantial value. In order to ensure that a third party cannot acquire such a microcontroller and read the contents of the read-only memory in order to build or program microcontrollers so that said third party would save the expenditure for the development of the program, testing of the contents of the read-only memory must be possible without these contents being directly detectable from the outside.

In accordance with said U.S. Pat. No. 4,777,586 this is realized in that the contents of the read-only memory are read by means of a separately generated clock signal in order to be applied to a separate comparator which receives externally applied test data upon inversion of said clock signal. The occurrence of errors is stored and output to the environment, via a separate output, after a predetermined number of test steps. A separate counter is required for counting this number of test steps. The comparator is provided with registers for the intermediate storage of the data read from the read-only memory and the test data. Thus, a number of additional elements are required for testing the contents of the read-only memory, which elements require an additional surface area on the integrated circuit.

SUMMARY OF THE INVENTION

Therefore, it is an object of the invention to provide a method of the kind set forth which enables the testing of the contents of the read-only memory in the integrated circuit to be performed with a minimum number of modifications, i.e. with a minimum amount of hardware.

To achieve this, in accordance with the invention there is provided a test program which is stored in the processor and which is activated in the test mode of the processor. Upon execution of said test program by the processor the contents of the read-only memory are successively read and applied, together with the corresponding, externally supplied test data, to the arithmetic unit for comparison. Any error message which occurs is stored in the storage register and is output only at the end of the test program via a connection which acts as a data connection during normal operation of the processor.

Thus, only a small additional memory will be required for the test program which need comprise only few instructions, and for the remainder of the execution of the test use is made exclusively of elements of the processor or the integrated circuit which have already been provided for normal operation. As a result, with the exception of the additional test program memory, substantially no modifications are required for performing the test in the integrated circuit; additional connections, notably for the error message, are not required either.

In principle it is sufficient to obtain information concerning the correctness of the contents of the read-only memory or whether an error has occurred. For many purposes, for example for correction, if any, of the manufacturing process, however, it is also advantageous to know whether many errors are present in the contents of the read-only memory. In a version of the method in accordance with the invention, therefore, each error message occurring is temporarily stored and at the end of the test program a message concerning the number of error messages is output to the environment. This number of error messages can again be determined, stored and output merely by way of program steps of the processor, without additional hardware being required.

A device for performing the method in accordance with the invention, comprising an integrated circuit which comprises a processor having an arithmetic unit and at least one storage register and one read-only memory as well as a number of external connections, at least one of which is connected to a test device supplying test data, is characterized in that the integrated circuit comprises a test program memory for storing control instructions of a test program in that, after having been switched to the test mode, the processor reads control instructions from the test program memory and successively reads, under the control of these control instructions, the data from the read-only memory and applies these data, together with the test data supplied, to the arithmetic unit for comparison, and in that in the case of a control signal indicating non-correspondence of the supplied data the arithmetic unit modifies the contents of the storage register with respect to a predetermined initial state and applies, at the end of the test program, the contents of the storage register to a connection which acts as a data output during normal operation of the integrated circuit.

In an embodiment of the device in accordance with the invention the processor increments the contents of the storage register, the contents being a binary number, by one unit in response to each control signal from the arithmetic unit. This can be realized by way of appropriate instructions in the test program.

In order to minimize the modification of customary microcontrollers required for performing the test of the ROM contents in accordance with the invention, in a further embodiment of the invention the read-only memory and the test program memory are connected to the processor via a switch which is switched in dependence on the test mode and on the progress of the test program. Thus, the processor can be controlled successively by the test program memory and the read-only memory as the actual program memory. The switch consists of, for example the bus switches already present at the output of the memory.

The test program memory may be realized in various ways. Preferably, the test program memory is a read-only memory. The contents thereof are then defined, like the contents of the read-only memory for the program, during the manufacture of the integrated circuit and cannot be abusively modified.

It may also be that the contents of the test program memory include errors, so that an error in the contents of the read-only memory can become apparent for the program, even though it is actually correct and the microcontroller is, therefore operational, because the test program is not used during normal operation. Therefore, the contents of the test program memory are preferably accessible from outside the integrated circuit. Thus, first the contents of the test program memory are then tested, which can be customarily done by way of a comparison outside the integrated circuit because the contents of the test program memory are of no significance to third parties. It is only when the test program is correct that the actual testing of the read-only memory for the program can be performed, so that an error message then occurring can in any case be attributed to an error in the contents of the program memory.

BRIEF DESCRIPTION OF THE DRAWING

Embodiments in accordance with the invention will be described in detail hereinafter with reference to the drawing. Therein.

DETAILED DESCRIPTION OF THE PREFERRED EMBODIMENT

Figure 1:
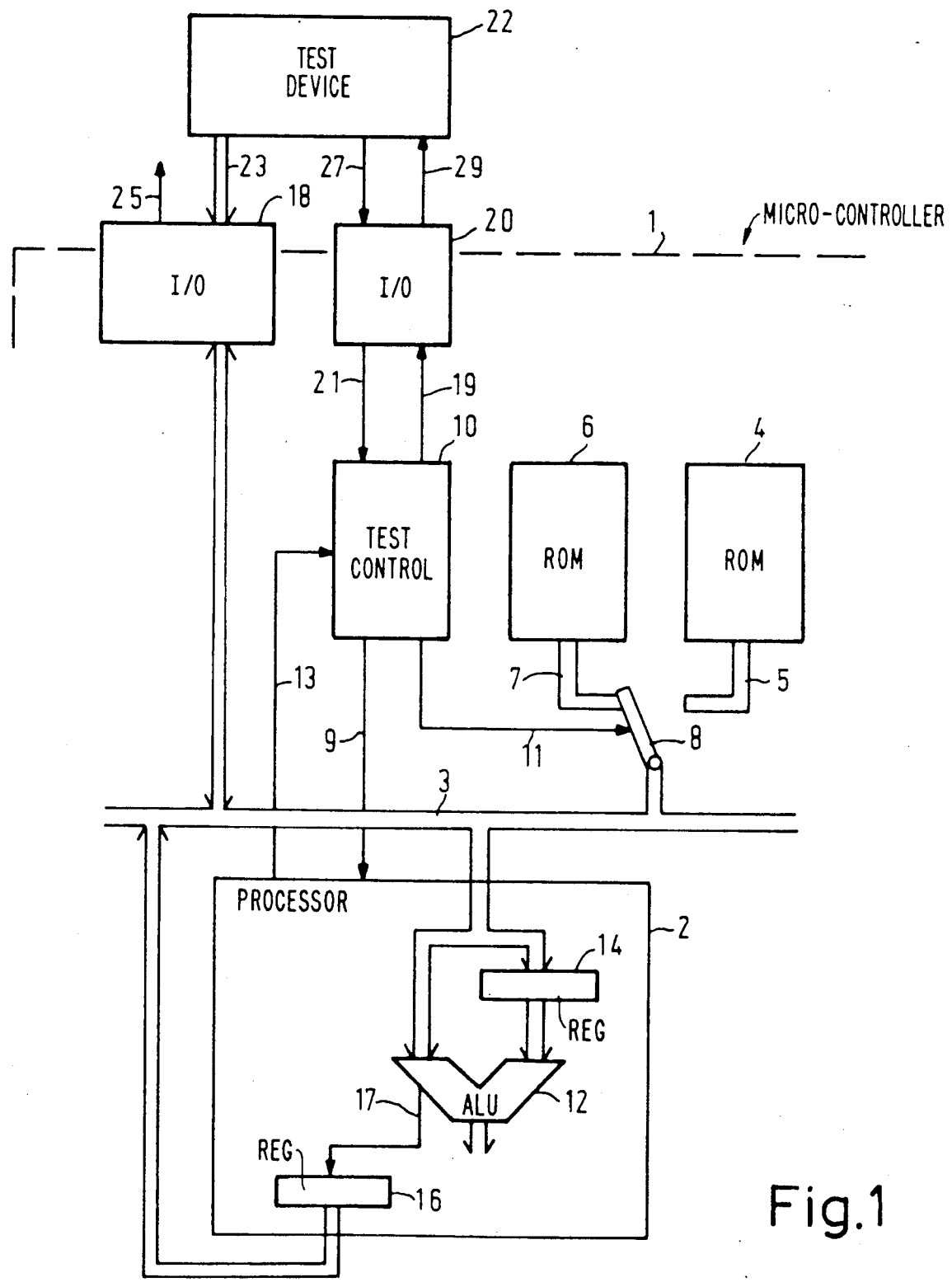
FIG. 1 shows a diagrammatic block diagram of the essential parts of a device in accordance with the invention.

FIG. 1 shows a microcontroller 1 which is constructed as a monolithic integrated circuit and which is connected to a test device 22. Only the elements of the microcontroller 1 which are important for the following description are shown; other elements having been omitted for the sake of clarity.

An essential part of the microcontroller 1 is formed by the processor 2, also referred to as CPU, which comprises a number of circuits, only the circuits which are important for the following description being shown. First of all there is the arithmetic and logic unit 12 which is generally referred to as ALU. There is also shown a register 14 whose output is connected to a data input of the ALU, the other input of the ALU 12 and the input of the register being connected to an internal bus 3 (diagrammatically shown). A control output 17 of the ALU 12, carrying a signal when the result of the logic operation performed in the ALU 12 is unequal to zero, is connected to a further register 16 via program-controlled switches (not shown).

There is also provided a program memory 4 which contains the program to be executed by the microcontroller during normal operation and which is constructed as a read-only memory (ROM), as well as a further read-only memory 6 which contains the test program. The output 5 of the ROM 4 and the output 7 of the test program memory 6 can be connected as desired to the internal bus 3 via a switch 8. The addressing of the memories 4 and 6 is not separately shown and customarily takes place by the processor 2 via address leads in the bus 3. When the test program operates without loops and branches, the test program memory 6 could also be controlled by a separate address generator, for example a counter.

The switch 8 may be constructed as a multiplexer or be formed by bus data switches customarily connected behind the outputs of the two memories 4 and 6 and is controlled, via the lead 11, by a test control circuit 10 which controls the test mode in the microcontroller 1 and which itself is influenced by the CPU 2 via the lead 13. Such a test control circuit 10 is in any case provided for testing the integrated circuit 1, independent of the described testing of the contents of the ROM 4.

For test purposes the microcontroller 1 is connected to a test device 22 via the already present input/output circuits 18 and 20. The input/output circuits 18 and 20 comprise driver circuits for outgoing leads and receiver circuits for incoming leads, which circuits are at least partly controllable or switchable. This holds good notably for the input/output circuits 18 via which data words can be exchanged with externally connected devices, i.e. in this case also with the test device 22. In the device 18 the outgoing data leads are often associated with a register so that these data need be only briefly generated by the processor 2 and remain externally available for a prolonged period of time.

In order to perform the test, the test device 22 transmits, via the lead 27 which may actually comprise a plurality of leads, a signal for adjusting the test mode, which signal is applied to the test control circuit 10 via the input/output circuit 20 and the lead 21. Before that, the test device 22 as well as the microcontroller 1 have been set to an initial state by a reset signal (not shown). The test control circuit 10 then sets, via the lead 11, the switch 8 to the position shown, thus transferring the first test construction from the test program memory 6, via the bus 3, to the processor 2 in which it is stored, for example in an instruction register (not shown). Subsequently, further instructions may be given, if any, which set the processor 2 to a desired state. Instead, or in addition thereto, the processor 2 may also be set to the test mode via a connection 9.

Subsequently, the test control circuit 10 briefly switches over the switch 8 and applies the first data word from the ROM 4, via the bus 3, to the processor 2 in which it is temporarily stored in the register 14 and is present on an input of the ALU 12. Subsequently, the switch 8 is switched back to the position shown and a data word generated on the output lead 23 by the test device 22 and corresponding to the first correct data word in the ROM 4 is applied to the other input of the ALU 12 via the input/output circuit 18 and the bus 3, after which the two data words are compared, for example by adjusting the ALU for a subtraction or a logic comparison function, if present. On the lead 17 it is merely indicated whether correspondence or non-correspondence has been detected. In the latter case, i.e. the case where the first word in the ROM 4 does not correspond to the predetermined contents, the corresponding signal on the line 17 is written into the register 16.

After the comparison, or simultaneously therewith, the address for the ROM 4 is incremented by 1 and, moreover, via the lead 13 the test control circuit 10 receives a signal for the end of a test step; in response thereto, the test control circuit 10 issues, via the lead 19, a synchronization signal which is applied, via the input/output circuit 20 and the lead 29, to the test device 22 in which it enables the next comparison value on the lead 23. Furthermore, via the lead 11 the switch 8 is again switched over to the position shown and the next test step is performed in the same manner. Thus, the contents of the ROM 4 are successively compared with corresponding comparison values from the test device 22. When a plurality of error signals are then generated on the lead 17, the contents of the register 16, being a binary number, can be incremented each time by one step corresponding control by the CPU 2.

When ultimately the last, i.e. the highest address, has been generated for the ROM 4, the test control circuit 10 terminates the test and switches the switch 8 permanently to the position which is not shown; moreover, the contents of the register 16 whose output can be customarily connected to the bus 3, are output on an output 25 via the input/output circuit 18. The contents are customarily formed by a data word in which, for example the values of given data bits indicate whether or not an error signal has occurred during the test.

Figure 2:
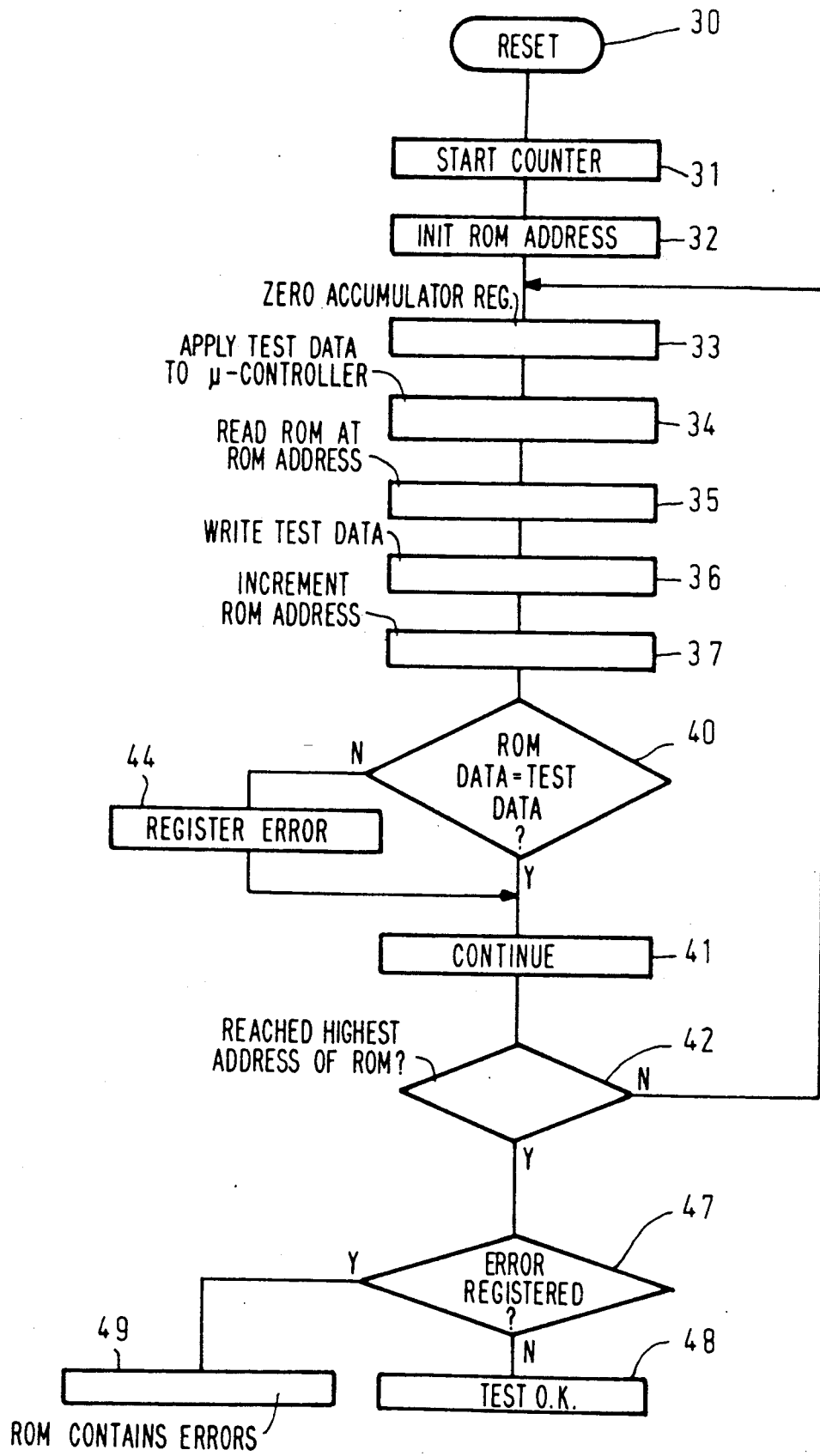
FIG. 2 shows a flowchart illustrating a possible execution of the method in accordance with the invention.

The execution of the test procedure described with reference to the device shown in FIG. 1 will be illustrated in a more general form with reference to the flowchart of FIG. 2.

In block 30 the entire assembly, i.e. the microcontroller and the test device, is reset to a defined initial state. In block 31 a counter in the test device 22 which successively addresses the test data is set to the initial position and in block 32 the address of the ROM is set to the initial address. Moreover, in block 33 the ALU or the accumulator register forming part thereof is set to zero.

Via an input/output circuit, in block 34 a signal is generated which triggers the test device to apply the next test data to the microcontroller. In block 35 the memory location in the ROM which is addressed by the processor is read and applied to the processor, and in block 36 the test data produced by the test device are written. In block 37 the address for the ROM is incremented by 1 in a preparatory fashion.

In block 40 it is tested whether the data read from the ROM (block 35) correspond to the data supplied by the test device 22 (block 36). If this is not the case, in block 44 an error register is set or an error counter is incremented, after which the procedure continues with block 41; in the case of correspondence of the two data, however, the procedure immediately proceeds to the block 41 in which the signal on the output of the microcontroller, requesting data from the test device 22, is reset. Finally, in block 42 it is tested whether the last address read is the highest address of the ROM, i.e. because of the block 37 it is tested whether the next address supplied by the processor is higher than the highest address of the ROM. If this is not the case, the procedure returns to the block 33 and is repeated again.

When the last address of the ROM, however, has been read, it is tested in block 47 whether the error register has been set or whether the error counter has left its initial position. If this is not the case, a data word is produced on an output in the described manner in order to indicate that the test has been completed and that no error has occurred; in the case of a set error register or an incremented counter in the block 49, however, another data word is generated on the output of the microcontroller in order to indicate that the ROM contains errors. This terminates the test procedure.

Instead of the test in the block 47, after the block 42 the contents of the error register or the error counter can also be unconditionally output to the environment, because the contents thereof directly indicate whether or not an error has occurred.

What is claimed is:

1. A method for testing the contents of a read-only memory in an integrated circuit, the method comprising the steps of:
   (a) switching a processor of the integrated circuit to a test mode, which processor is controlled by contents of the read-only memory;
   (b) activating a test program stored in the processor to control the processor rather than the contents;
   (c) receiving externally supplied test data at the processor via external connections of the integrated circuit;
   (d) under control of the test program,
      (i) successively reading the contents;
      (ii) comparing the contents and the externally supplied test data in an arithmetic unit of the processor;
      (iii) supplying an error message in response to a negative comparison result;
      (iv) storing any error message in a storage register of the processor;
      (v) only outputting any stored error message after the end of the test program, via an external connection of the integrated circuit which is also a data connection during normal operation of the processor,
   whereby the contents are tested without the contents being either supplied or accessible externally to the integrated circuit.

2. The method of claim 1 wherein:
   the outputting step further comprises outputting a message including the number of error messages; and
   the method further comprises the step of deleting any stored error messages after the outputting step.

3. A device for testing a read-only memory in an integrated circuit, which integrated circuit comprises a microprocessor having an arithmetic unit; at least one storage register; a plurality of external connections, at least one of the external connections being for connecting to a test apparatus supplying test data, the device comprising, within the integrated circuit:
   (a) a test program memory for storing control instructions of a test program;
   (b) means for switching the processor into a test mode, so that the processor reads control instructions from the test program memory and successively reads, under the control of these control instructions, data from the read-only memory;
   (c) means for supplying the data from the read only-memory and the test data to the arithmetic unit for comparison;
   (d) means for supplying a control signal indicating non-correspondence of the test data and the data from the read-only memory;
   (e) means for modifying the contents of the storage register with respect to a predetermined initial state in response to the control signal;
   (f) means for applying, at the end of the test program, the contents of the storage register to one of the external connections which acts as a data output during normal operation of the integrated circuit;
   whereby contents of the read-only memory are tested without the contents being either supplied or accessible externally to the integrated circuit.

4. A device as claimed in claim 3, characterized in that for each control signal of the arithmetic unit (12) occurring the processor (2) increments the contents of the storage register (16), being a binary number, by one unit.

5. A device as claimed in claim 4, characterized in that the only read-only memory (4) and the test program memory (6) are connected to the processor (2) via a switch (8) which is switched in dependence on the test mode and on the progress of the test.

6. A device as claimed in claim 5, characterized in that the test program memory (6) is a read-only memory.

7. A device as claimed in claim 4, characterized in that the test program memory (6) is a read-only memory.

8. A device as claimed in claim 4, characterized in that the contents of the test program memory (6) are accessible from outside the integrated circuit (1).

9. A device as claimed in claim 3, characterized in that the read-only memory (4) and the test program memory (6) are connected to the processor (2) via a switch (8) which is switched in dependence on the test mode and on the progress of the test.

10. A device as claimed in claim 9, characterized in that the test program memory (6) is a read-only memory.

11. The device of claim 9, wherein the contents of the test program memory are accessible from outside the integrated circuit.

12. A device as claimed in claim 3, characterized in that the test program memory (6) is a read-only memory.

13. The device of claim 12, wherein the contents of the test program memory are accessible from outside the integrated circuit.

14. A device as claimed in claim 3, characterized in that the contents of the test program memory (6) are accessible from outside the integrated circuit (1).

* * * * *